United States Patent
Phan

(10) Patent No.: US 11,367,480 B2
(45) Date of Patent: Jun. 21, 2022

(54) MEMORY DEVICE IMPLEMENTING MULTIPLE PORT READ

(71) Applicant: Marvell Asia Pte, Ltd., Singapore (SG)

(72) Inventor: Michael ThaiThanh Phan, Cary, NC (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 17/104,953

(22) Filed: Nov. 25, 2020

(65) Prior Publication Data

US 2021/0174867 A1    Jun. 10, 2021

Related U.S. Application Data

(60) Provisional application No. 62/943,682, filed on Dec. 4, 2019.

(51) Int. Cl.

| G11C 11/412 | (2006.01) |
|---|---|
| G11C 11/418 | (2006.01) |
| G11C 11/419 | (2006.01) |
| G06F 12/0893 | (2016.01) |
| G11C 7/10 | (2006.01) |
| G06F 12/0895 | (2016.01) |
| G06F 12/0897 | (2016.01) |
| G11C 8/16 | (2006.01) |
| G11C 7/12 | (2006.01) |

(52) U.S. Cl.
CPC ........ *G11C 11/419* (2013.01); *G06F 12/0893* (2013.01); *G11C 11/412* (2013.01); *G11C 11/418* (2013.01); *G06F 12/0895* (2013.01); *G06F 12/0897* (2013.01); *G06F 2212/1028* (2013.01); *G06F 2212/603* (2013.01); *G11C 7/1045* (2013.01); *G11C 7/1069* (2013.01); *G11C 7/1096* (2013.01); *G11C 7/12* (2013.01); *G11C 8/16* (2013.01)

(58) Field of Classification Search
CPC ... G11C 11/419; G11C 11/412; G11C 11/418; G06F 12/0893; G06F 2212/603
USPC ....................................................... 365/156
See application file for complete search history.

(56) References Cited

U.S. PATENT DOCUMENTS

| 10,037,290 B1 * | 7/2018 | Lee .................... G06F 13/1663 |
| 10,049,709 B2 * | 8/2018 | Yeung .................. G11C 11/413 |
| 10,726,909 B1 * | 7/2020 | Dhani Reddy ....... G11C 11/419 |

(Continued)

FOREIGN PATENT DOCUMENTS

| CA | 2180421 C * | 9/2001 | ............. G11C 29/02 |
| WO | WO-2005041203 A1 * | 5/2005 | ........... G11C 11/412 |

*Primary Examiner* — Ly D Pham
(74) *Attorney, Agent, or Firm* — Hamilton, Brook, Smith & Reynolds, P.C.

(57) ABSTRACT

A memory device provides for a multiple-port read operation, and includes an array of bitcells and a control circuit. Each bitcell of the array includes a write wordline port and a first read wordline port. The control circuit provides an output to the write wordline port, and includes as inputs a write select port and a second read wordline port. In a write mode, the control circuit couples the write select port to the output and disables the second read port. In a read mode, the control circuit couples the second read wordline port to the output and disables the write select port, thereby enabling a multiple-port read operation to the array of bitcells.

20 Claims, 6 Drawing Sheets

(56) References Cited

U.S. PATENT DOCUMENTS

| | | | |
|---|---|---|---|
| 2009/0207642 A1* | 8/2009 | Shimano | G11C 11/1675 365/72 |
| 2014/0198562 A1* | 7/2014 | Hwang | G11C 11/412 365/154 |
| 2016/0358643 A1* | 12/2016 | Kolar | G11C 11/418 |
| 2019/0130965 A1* | 5/2019 | Siddiqui | G11C 11/419 |

* cited by examiner

MEMORY DEVICE IMPLEMENTING MULTIPLE PORT READ

RELATED APPLICATION

This application claims the benefit of U.S. Provisional Application No. 62/943,682, filed on Dec. 4, 2019. The entire teachings of the above application are incorporated herein by reference.

BACKGROUND

Typical central processing units (CPUs) implement an arithmetic logic unit (ALU), processor registers, a control unit, and a cache within a common integrated circuit. The ALU performs arithmetic and logic operations, while the processor registers provide operands to the ALU and store the results of ALU operations. The control unit manages operations of the CPU, including retrieving instruction from memory and directing the ALU, registers and other components to execute those instructions. The cache provides a temporary store for instructions and data retrieved from memory or generated by the ALU, and often includes separate caches for storing instructions and data.

SUMMARY

Example embodiments include a memory device comprising an array of bitcells and a control circuit. The array of bitcells may include a plurality of rows of bitcells, each bitcell of the array including a write wordline port and a first read wordline port. The control circuit may be communicatively coupled to at least one bitcell of the array of bitcells, and may include 1) a write select port, 2) a second read wordline port, 3) an output coupled to the write wordline port of the at least one bitcell. In a write mode, the control circuit may be configured to couple the write select port to the output and disable the second read port. In a read mode, the control circuit may be configured to couple the second read wordline port to the output and disable the write select port.

The control circuit may be further configured to select one of the write mode and the read mode based on a mode signal indicating whether received instructions correspond to a write operation or a read operation. The memory device may further include a read decoder driver circuit configured to drive the second read wordline port, as well as a read decoder driver circuit configured to drive the first read wordline port. The control circuit may be one of a plurality of control circuits, each of the plurality of control circuits being communicatively coupled to a respective subset of the array of bitcells. Alternatively, each of the plurality of control circuits may be communicatively coupled to a respective one of the plurality of rows of bitcells.

The control circuit may include a multiplexor configured to selectively connect the second read wordline port to the output based on a signal indicating whether the read mode is active. Each bitcell of the array is an 8-transistor (8T) SRAM bitcell. The memory device may be a level-1 data cache implemented with a processor in an integrated circuit. The memory device may further include an interface module communicatively coupled to the array of bitcells, and the interface module may include at least one sense amplifier configured to drive a read output based on a bitline output at at least one of the array of bitcells. The interface module may further include at least one write driver communicatively coupled to the at least one sense amplifier via the bitline channel, the write driver being configured to drive a data signal to the at least one of the array of bitcells via the bitline channel.

Further embodiments include a method of operating a memory device having an array of bitcells including a plurality of rows of bitcells, each bitcell of the array including a write wordline port and a first read wordline port. In a write mode, a write wordline signal may be transmitted to the write wordline port, and a second read wordline port external to the array of bitcells may be disabled. In a read mode, a second read wordline signal may be transmitted to the write wordline signal via the second read wordline port.

One of the write mode and the read mode may be selected based on a mode signal indicating whether received instructions correspond to a write operation or a read operation. The second read wordline port may be driven via a differential amplifier circuit. The first read wordline port may be driven via a dynamic circuit. A read output may be driven via a sense amplifier based on a bitline output at at least one of the array of bitcells. In the read mode, a write select port external to the array of bitcells may be disabled.

The second read wordline port may be selectively connected to the output based on a signal indicating whether the read mode is active. Each bitcell of the array may be an 8-transistor (8T) SRAM bitcell. The memory device may be a level-1 data cache implemented with a processor in an integrated circuit. A read output may be driven based on a bitline output at a bitline channel of at least one of the array of bitcells, and a data signal may be driven to the at least one of the array of bitcells via the bitline channel Further embodiments include a memory device including an array of bitcells including a plurality of rows of bitcells, each bitcell of the array including a write wordline port and a first read wordline port. The device may further include means for, in a write mode, transmitting a write wordline signal to the write wordline port and disabling a second read wordline port external to the array of bitcells. The device may also include means for, in a read mode, transmitting a second read wordline signal to the write wordline signal via the second read wordline port.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Figure 1:
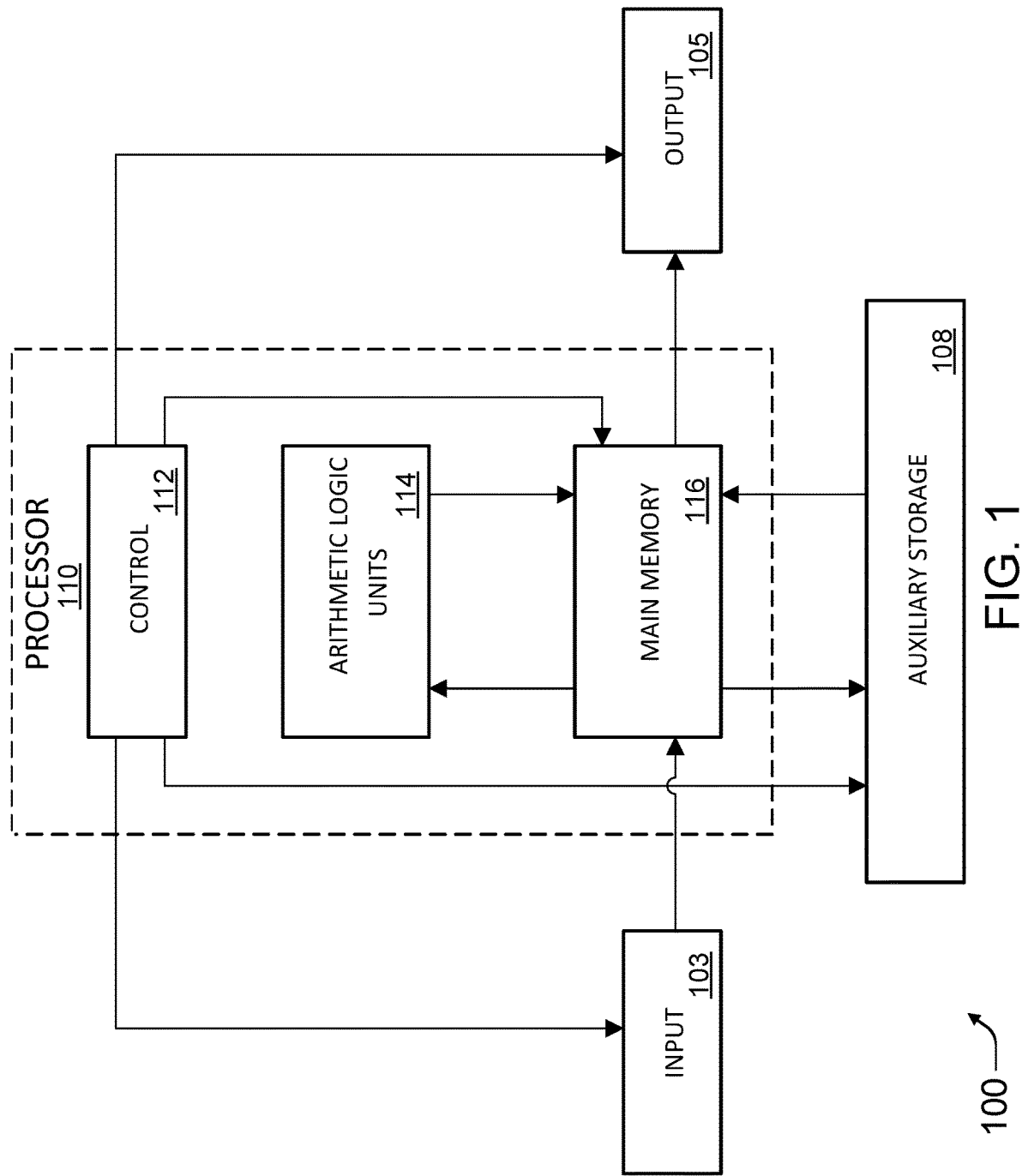
FIG. 1 is a block diagram of a processor subsystem in which example embodiments may be implemented.

FIG. 1 is a block diagram of a processor subsystem 100 in which example embodiments may be implemented. A processor 110 (e.g., a central processing unit (CPU)) includes arithmetic logic units (ALUs) 114, a control unit 112, and a memory 116, which may include an instruction cache and a hierarchy of data caches (e.g., L1 data cache, L2 data cache, etc.). The ALUs 114 may perform arithmetic and logic operations, and may include processor registers (not shown) to provide operands to the ALUs and store the results of ALU operations. The control unit 112 manages operations of the processor, including retrieving instructions from the memory 116 and/or an auxiliary storage unit 108 (e.g., a DRAM memory and/or other data storage device) and directing the ALUs 114 to execute those instructions. The control unit 112 may also manage an input/output (I/O) interface at the processor, including an input driver 103 to receive external data and an output driver 105 to provide a data output of the processor. The memory 116 provides a temporary store for instructions and data retrieved from memory or generated by the ALUs 114.

Figure 2:
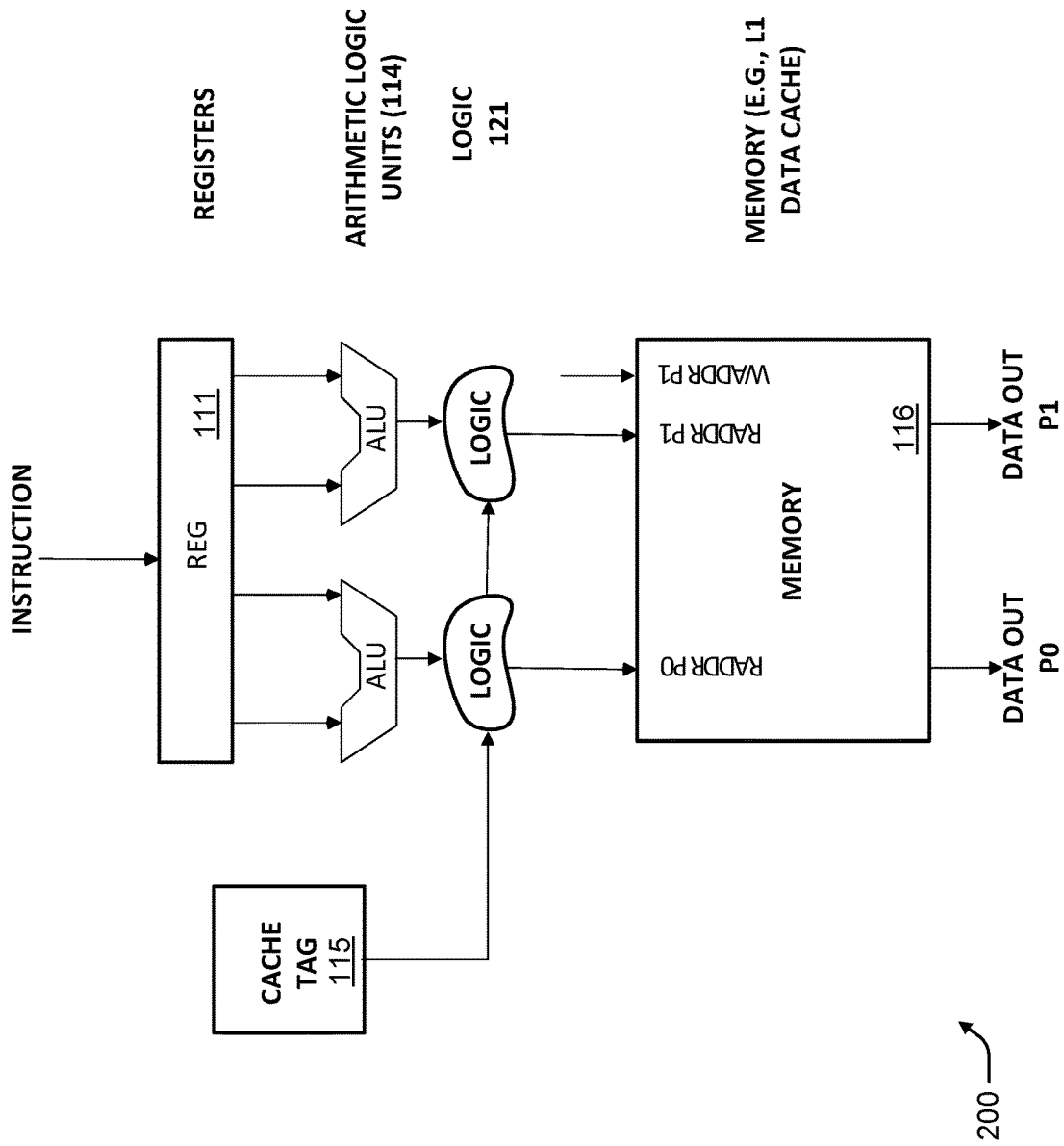
FIG. 2 is a flow diagram of a data flow through the processor subsystem.

FIG. 2 illustrates a data flow 200 through the processor subsystem 100 during a memory access operation. In response to receiving a CPU instruction at the general-purpose register 111 to perform a load (read) operation, the ALUs 114 may perform the address generation necessary to locate the data indicated by the load operation. While the ALUs 114 are performing address generation for each read port, the processor 110 may also read an L1 cache tag 115, which indicates data that is located at the L1 data cache of the memory 116. Circuit logic 121 may perform a lookup of the cache tag 115 based on the targeted address to generate a "hit" or "miss" result indicating whether target data is located at the L1 data cache of the memory 116. The processor 110 then uses this hit/miss information and the address generated by the ALUs 114 to form a completed set of addresses to forward to the memory.

The memory 116 (e.g., a L1 data cache) may comprise an array of bitcells and control and interface circuitry as described in further detail below with reference to FIGS. 3-6. To facilitate load and store operations, the memory 116 may include two read ports (RADDR P0, RADDR P1) and a single write port (WADDR P1). In response to receiving a load instruction and an address at the read ports as described above, the memory 116 may output the target data of the load operation at data output ports (DATA OUT P0, DATA OUT P1). The memory 116 may provide the two read ports in order to support computing protocols requiring such a configuration. For example, the memory 116 may support scalable vector extension (SVE) wide vectors in an instruction set such as the single instruction/multiple data (SIMD) instruction set for the AArch64 architecture. The advantages of such a configuration include a smaller circuit area and less power consumption compared to architectures using single-read-port 6T SRAM and/or two-read-port 10T SRAM bitcells. In contrast, if the access operation were a store operation, the memory would receive the address at the write port and then write the received data to the specified address.

Figure 3:
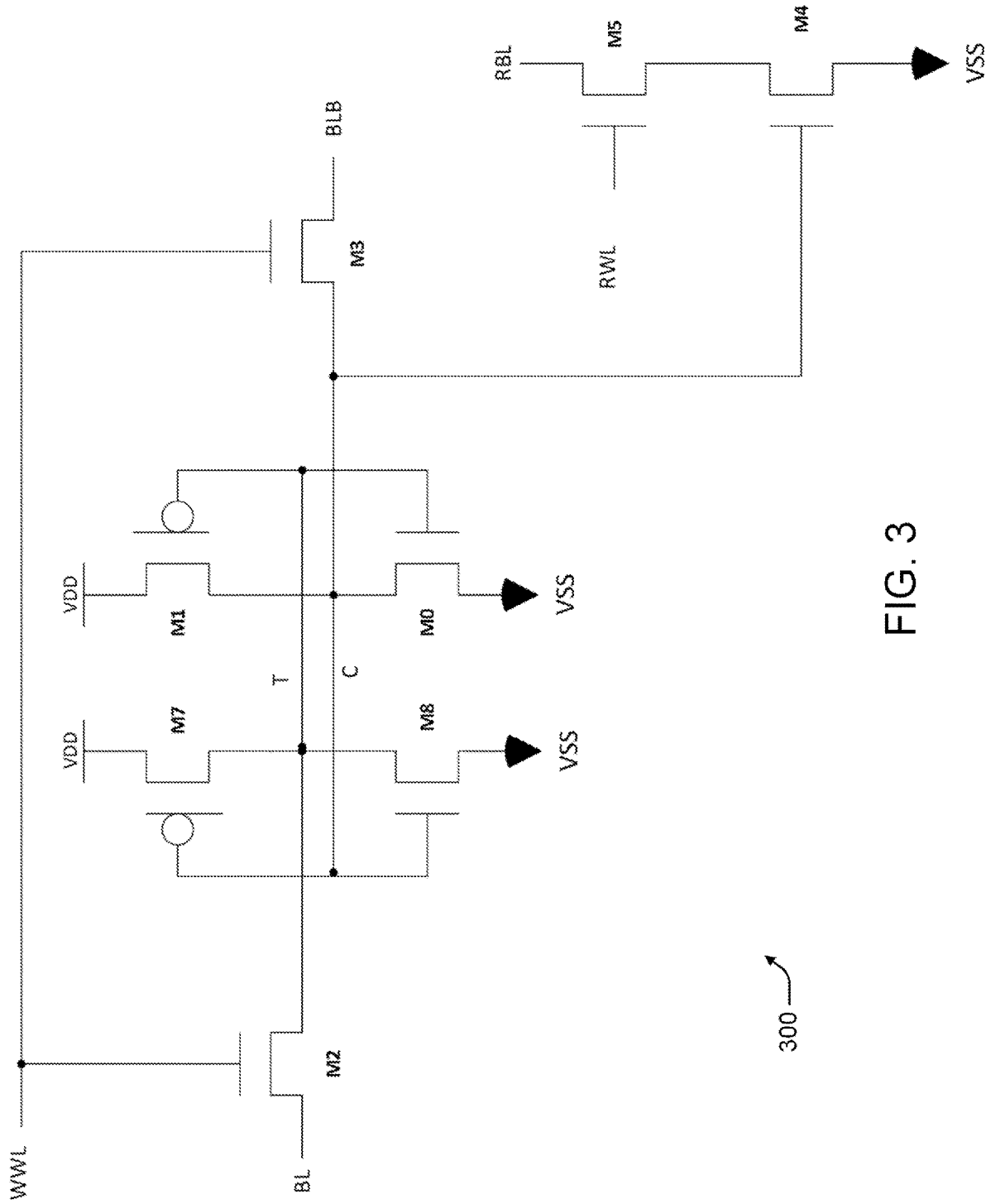
FIG. 3 is a schematic of a bitcell that may be implemented in one embodiment.

FIG. 3 is a schematic of a bitcell 300 that may be implemented in example embodiments. The bitcell 300 may implement one or more features of an 8-transistor (8T) SRAM bitcell as known in the art, having a single write wordline (WWL) port and a single read wordline (RWL) port. As shown, the WWL node controls transistors (e.g., NFETs) M2 and M3, which, in turn, selectively pass the bitline signals BL and BLB to the cross-coupled inverters comprising transistors M0, M1 and M8, M7. In contrast, the RWL node controls transistor M5, which selectively passes the read bitline (RBL) signal. When the RWL node activates (pulses high) transistor M5, the RBL signal may be connected to ground via transistor M4, which is active as a function of the state (high/low) of node C at the cross-coupled inverters. Thus, the RBL node may indicate the state of node C as a value stored at the cross-coupled inverters.

During a write operation, the WWL signal may be pulsed high (e.g., logic 1) and the RWL signal is inactive (logical 0). When WWL is pulsed high, the NFET M2 and M3 are active and allow the BL and BLB to write their indicated values to the cross-coupled inverters M0, M1 and MN8, MN7. During a read operation, the RWL signal may be pulsed high, and WWL is inactive. When the RWL signal is pulsed high, transistor M5 is active. If node C holds a low state (i.e., 0), then transistor M4 is inactive, and thus RBL will not be discharged to ground or remain at a pre-charged value. In this case, the read operation may be read as a 1. In contrast, if node C holds a high state (i.e., 1), then NFET M4 is active, and RBL will be discharged to ground. In this case, the read operation may be read as a 0.

Memory devices, such as the memory 116 described above, may implement an array of bitcells such as the bitcell 300 to store data. However, some memory devices, such as a level 1 (L1) data cache implemented in many CPUs, may require two read ports, as exemplified by the memory 116 illustrated in FIG. 2. However, a bitcell such as the 8T bitcell 300 includes only a single WWL port and a single RWL port. Thus, to meet the requirement of two read ports, prior approaches have implemented bitcells in a redundant fashion. For example, existing L1 data caches may provide a 2-port read and 1-port write 32 KB data store by implementing 64 small, single-port 32×78 instance SRAM cells. Such an approach is inefficient, as the resulting SRAM array occupies a large area the CPU and requires substantial power to operate.

Example embodiments, in contrast, provide a bitcell such as an 8T SRAM cell with a two-port read and a one-port write configuration, enabling such bitcells to be implemented in memory devices having such requirements. In one example embodiment, a foundry waiver rule 8T SRAM cell may be implemented in a memory device (e.g., a 32 KB L1 data cache) with a 2-port read and 1-port write SRAM array to support 2 load operations and 1 store operation. The resulting memory device may exhibit a 3.35× smaller area and consume less power when compared against existing memory devices.

Figure 4:
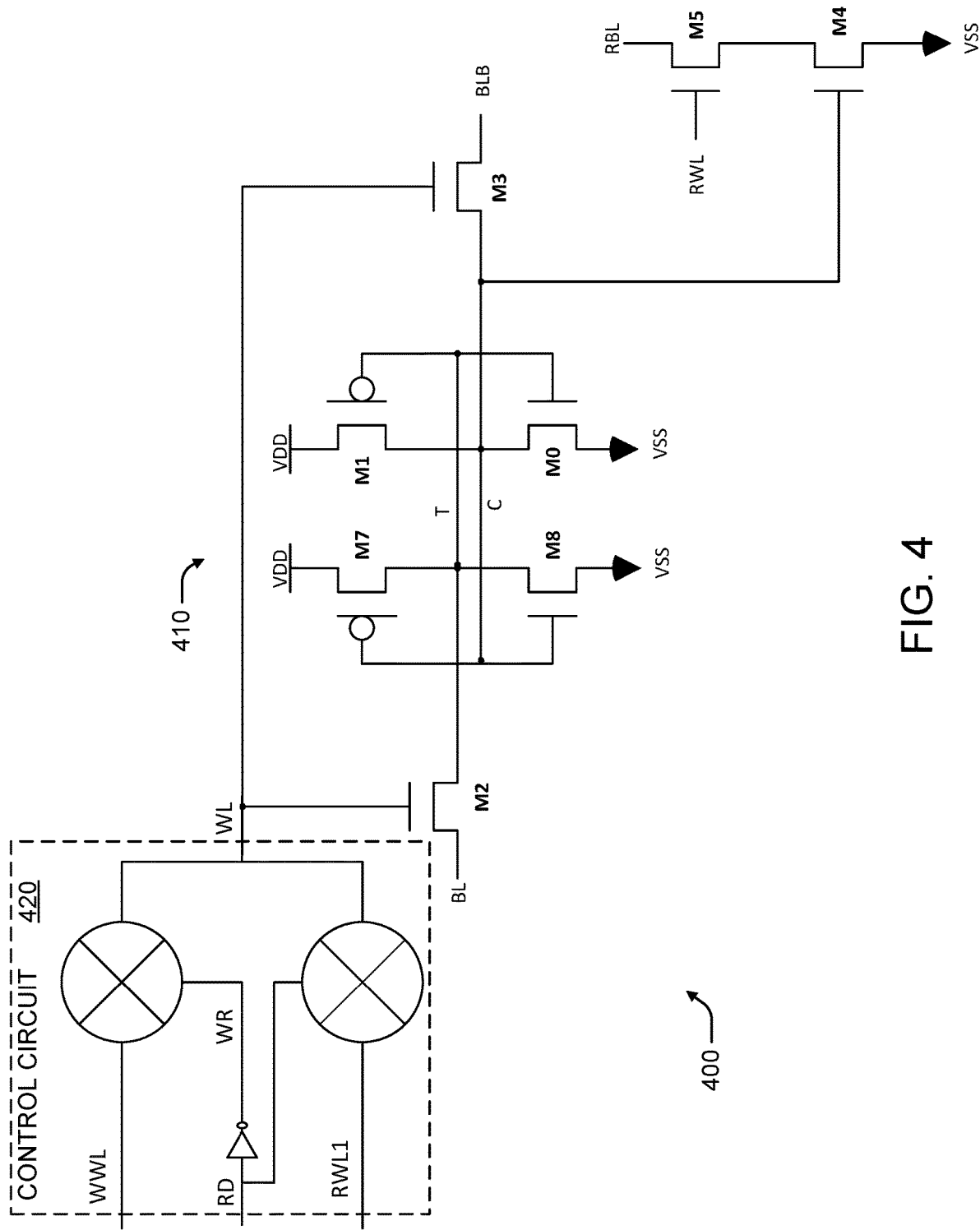
FIG. 4 is a schematic of a bitcell device in one embodiment.

FIG. 4 is a schematic of a bitcell device 400 in one embodiment. The bitcell device 400 includes a bitcell 410, which may include some or all features of the bitcell 300 described above with reference to FIG. 3, including transistors M0-M8 and nodes configured as described above, with the exception that the WWL node of the bitcell 410 is now referred to as the wordline (WL) node.

Further, a control circuit 420 has an output that is communicatively coupled to the WL node, and includes two inputs: the WWL port and a second read wordline port (RWL1). A mode input (RD) may receive a signal (e.g., from the control unit) that indicates whether received instructions pertain to a read (load) operation or a store (write) operation. Based on the mode input signal, the control circuit 420 may enter a write mode or a read mode accordingly. In the write mode, the control circuit 420 may couple the WWL input (also referred to as a write select port) to the output connected to the WL node, thereby disabling the RWL1 port. In contrast, in the read mode, the control circuit 420 may couple the RWL1 input to the WL node, thereby disabling the WWL port. In this manner, the control circuit may operate as a multiplexer, selectively passing one of the WWL and RWL1 inputs through to the WL port of the bitcell 410 based on the write or read mode indicated by the mode select signal RD. To facilitate transmission of the RWL1 signal, a port two read decoder driver circuit (not shown) may be implemented to drive the RWL1 signal at the input of the control circuit 420. Further, a port one read decoder driver (not shown) may be implemented to drive the RWL signal at the bitcell 410.

As a result of this configuration, both wordline ports at the bitcell 410 (i.e., WL and RWL) can be active simultaneously during a read operation to enable two read operations or a 2-port read operation by the bitcell device 400. Further, a write operation may be carried out as described above with reference to FIG. 3, wherein the WWL signal at the control circuit 420 is applied to the WL input of the bitcell 410.

Figure 5:
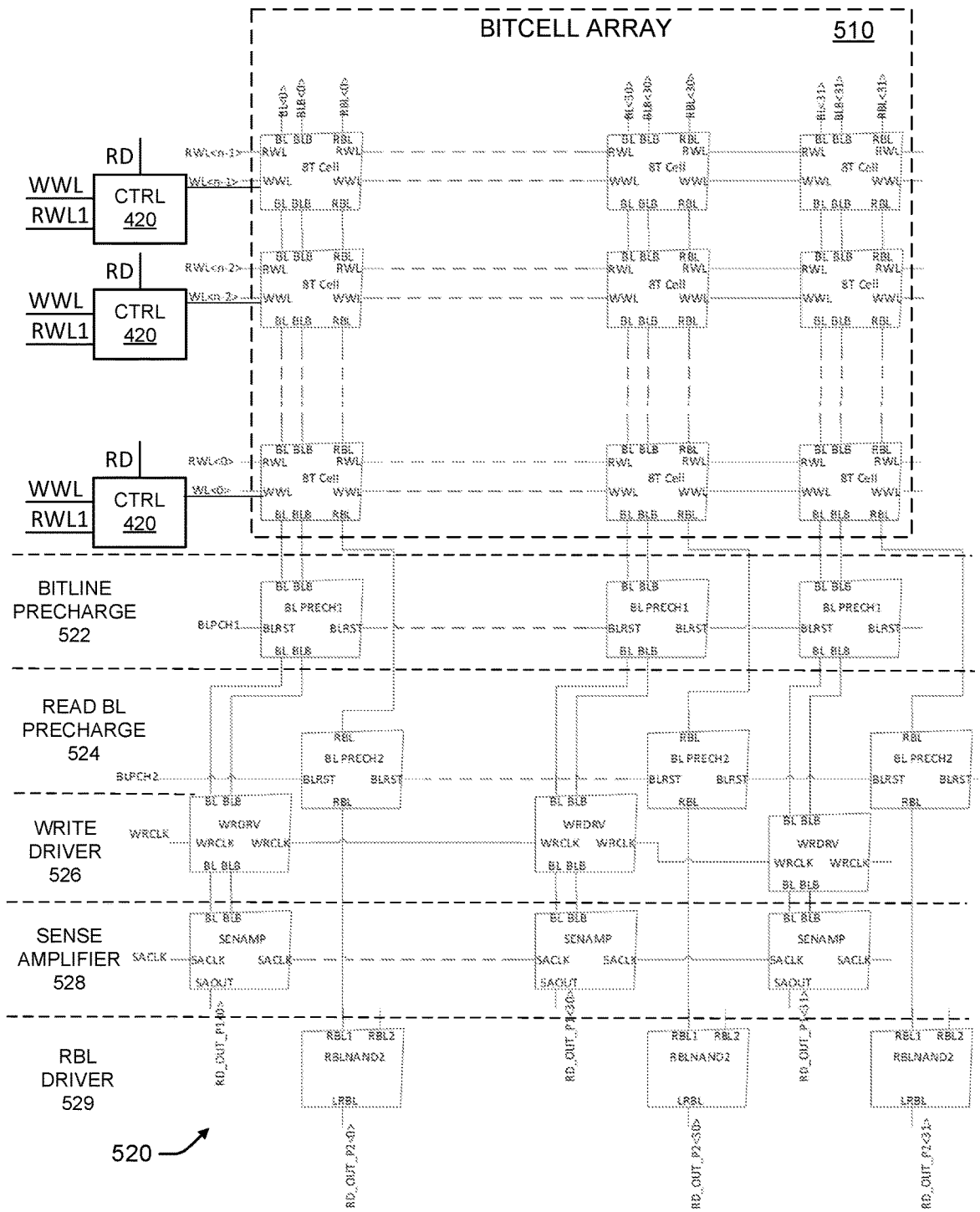
FIG. 5 is a schematic of a memory device in one embodiment.

FIG. 5 is a schematic of a memory device 500 in one embodiment. The memory device 500 may include a bitcell array 510 comprising a plurality of bitcells, such as the bitcell 410 described above, arranged into a plurality of rows and columns. Likewise, a plurality of control circuits 420 may be communicatively coupled to the bitcell array 510. In contrast to the configuration shown in FIG. 4, here, each of the control circuits 420 may be connected to the WL port of a respective subset of the bitcell array 510. For example, as shown, each of the control circuits is communicatively coupled to the WL port of a respective row of bitcells, wherein the row of bitcells are connected to common RWL and WL lines. In this illustrative example, the bitcell array 510 may comprise an array of n rows by 32 columns, wherein then row corresponds to WL<0> to WL<n−1> and RWL<0> to RWL<n−1> rows and BL<0> to BL<31>, BLB<0> to BLB<31>, RBL<0> to RBL<31> columns.

Interface circuitry 520 may be applied to each column of the bitcell array 510, and may include circuitry to facilitate both store and load operations. For the BL and BLB inputs of the bitcell array 510, each column may be connected as shown to a bitline precharge circuit 522 configured to generate a precharged signal to the BL and BLB inputs of each bitcell of the column. A respective write driver 526, enabled by a write clock (WRCLK) signal, may drive the BL and BLB signals to the bitline precharge circuit 522. Further, a respective sense amplifier 528 may be enabled by a sense amplifier clock (SACLK), which may include a differential amplifier configured to selectively output a read data signal (e.g., RD_OUT_P1). Thus, the interface circuitry 520 may support driving a read output based on a bitline output at a bitline channel of at least one of the array of bitcells, and driving a data signal to the at least one of the array of bitcells via the bitline channel, thereby transmitting read and write data via a common channel.

At the RBL inputs of the bitcell array 510, each column may be connected as shown to a respective read bitline precharge circuit 524, which is a dynamic circuit that can provide a precharged signal to the RBL input. Each read bitline precharge circuit 524 may connect to a respective read bitline driver 529, which is a dynamic circuit configured to provide a read output for the respective column during a load operation.

An example 2-port read operation may be carried out as follows. The WL<0> to WL<n−1> are one-hot and RWL<0> to RWL<n−1> are also one-hot, meaning that only one of the WL<0> to WL<n−1> is active and only one of RWL<0> to RWL<n−1> is active at a time. For example, if WL<0> and RWL<0> are active for a 2-port read operation, prior to WL<0> and RWL<0> are pulsed high as described above, the WRCLK, BLPCH1 and BLPCH2 are inactive or in an off state. Therefore, the bitlines BL<0> to BL<31>, BLB<0> to BLB<31>, RBL<0> to RBL<31> are floated and remain at previous precharged value. For port 1, when WL<0> is pulsed high, either BL<0> to BL<31> or BLB<0> to BLB<31> begin to discharge depending on the state of node C or T at each bitcell of the array 510. After the BL<0> to BL<31> or BLB<0> to BLB<31> are discharged to a differential value between true and compliment bitlines, the SACLK of the SENSAMP is pulsed high, which will enable a successful port 1 read 0 or 1 to outputs RD_OUT_P1<0> . . . RD_OUT_P1<30> and RD_OUT_P1<31>. For port 2, when RWL<0> is pulsed high, the RBL<0> to RBL<31> begin to discharge or remain at a previous precharged value depending on the state of node C inside of each bitcell of the array 510. The results of RBL<0> to RBL<31> are then transmitted to the RBLNAND2 circuits, thereby providing a port 2 read 0 or 1 to outputs RD_OUT_P2<0> . . . . RD_OUT_P2<30> and RD_OUT_P2<31>.

Figure 6:
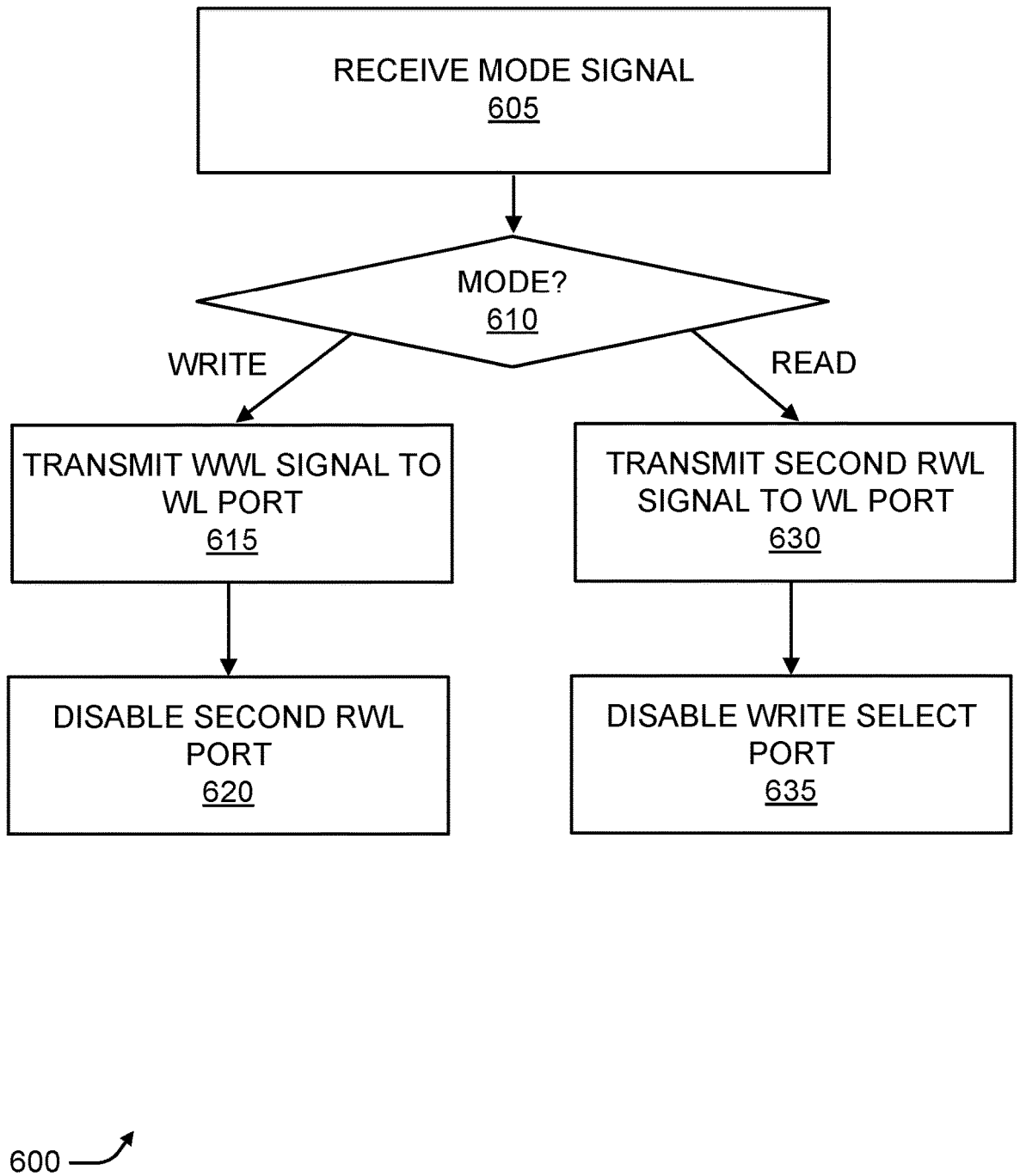
FIG. 6 is a flow diagram of a process of operating a memory device in one embodiment.

FIG. 6 is a flow diagram of a process 600 of operating a memory device in one embodiment. The process may be operated by the bitcell device 400 described above with reference to FIG. 4, or may be operated by a control circuit 420 communicatively coupled to a subset of the bitcell array as described above with reference to FIG. 5. With reference to FIG. 4, the control circuit 420 may receive a mode signal (e.g., from the control unit) at the input RD indicating whether received instructions pertain to a read operation or a store operation (605). Based on the mode input signal, the control circuit 420 may enter a write mode or a read mode accordingly (610). In the write mode, the control circuit 420 may couple the WWL input to the output connected to the WL node, thereby causing the WWL signal to be transmitted to the WL port of the bitcell 410 (615). Accordingly, the second read wordline port (RWL1) is disabled (620). In the read mode, the control circuit 420 may couple the RWL1 input to the WL node, thereby causing the RWL signal to be transmitted to the WL port of the bitcell 410 (630). Accordingly, the WWL port is disabled (635).

While example embodiments have been particularly shown and described, it will be understood by those skilled in the art that various changes in form and details may be made therein without departing from the scope of the embodiments encompassed by the appended claims.

What is claimed is:

1. A memory device, comprising:
  an array of bitcells including a plurality of rows of bitcells, each bitcell of the array including a write wordline port and a first read wordline port; and
  a control circuit communicatively coupled to at least one bitcell of the array of bitcells, the control circuit including 1) a write select port, 2) a second read wordline port, 3) an output coupled to the write wordline port of the at least one bitcell, the control circuit being configured to:
    in a write mode, couple the write select port to the output and disable the second read wordline port, and
    in a read mode, couple the second read wordline port to the output and disable the write select port, wherein the first read wordline port and second read wordline port selectively enable read operations.

2. The memory device of claim 1, wherein the control circuit is further configured to select one of the write mode and the read mode based on a mode signal indicating whether received instructions correspond to a write operation or a read operation.

3. The memory device of claim 1, further comprising a read decoder driver circuit configured to drive the second read wordline port.

4. The memory device of claim 1, wherein the control circuit is one of a plurality of control circuits, each of the plurality of control circuits being communicatively coupled to a respective subset of the array of bitcells.

5. The memory device of claim 1, wherein the control circuit is one of a plurality of control circuits, each of the plurality of control circuits being communicatively coupled to a respective one of the plurality of rows of bitcells.

6. The memory device of claim 1, wherein the control circuit includes a multiplexor configured to selectively connect the second read wordline port to the output based on a signal indicating whether the read mode is active.

7. The memory device of claim 1, wherein each bitcell of the array is an 8-transistor (8T) SRAM bitcell.

8. The memory device of claim 1, wherein the memory device is a level-1 data cache implemented with a processor in an integrated circuit.

9. The memory device of claim 1, further comprising an interface module communicatively coupled to the array of bitcells, the interface module including at least one sense amplifier configured to drive a read output based on a bitline output at a bitline channel of at least one of the array of bitcells.

10. The memory device of claim 9, wherein the interface module further includes at least one write driver communicatively coupled to the at least one sense amplifier via the bitline channel, the write driver being configured to drive a data signal to the at least one of the array of bitcells via the bitline channel.

11. A method of operating a memory device having an array of bitcells, the array including a plurality of rows of bitcells, each bitcell of the array including a write word line port and a first read word line port, the method comprising:
in a write mode, transmitting a write wordline signal to the write wordline port and disabling a second read wordline port external to the array of bitcells; and
in a read mode, transmitting a second read wordline signal to the write wordline signal via the second read wordline port and selectively enabling read operations via the first read wordline port and second read wordline port.

12. The method of claim 11, further comprising selecting one of the write mode and the read mode based on a mode signal indicating whether received instructions correspond to a write operation or a read operation.

13. The method of claim 11, further comprising driving the second read wordline port via a read decoder driver circuit.

14. The method of claim 11, further comprising driving a read output via a sense amplifier based on a bitline output at at least one of the array of bitcells.

15. The method of claim 11, further comprising, in the read mode, disabling a write select port external to the array of bitcells.

16. The method of claim 11, further comprising selectively connecting the second read wordline port to the output based on a signal indicating whether the read mode is active.

17. The method of claim 11, wherein each bitcell of the array is an 8-transistor (8T) SRAM bitcell.

18. The method of claim 11, wherein the memory device is a level-1 data cache implemented with a processor in an integrated circuit.

19. The method of claim 11, further comprising driving a read output based on a bitline output at a bitline channel of at least one of the array of bitcells, and driving a data signal to the at least one of the array of bitcells via the bitline channel.

20. A memory device, comprising:
an array of bitcells including a plurality of rows of bitcells, each bitcell of the array including a write wordline port and a first read wordline port;
means for, in a write mode, transmitting a write wordline signal to the write wordline port and disabling a second read wordline port external to the array of bitcells; and
means for, in a read mode, transmitting a second read wordline signal to the write wordline signal via the second read wordline port and selectively enabling read operations via the first read wordline port and second read wordline port.

* * * * *

UNITED STATES PATENT AND TRADEMARK OFFICE
CERTIFICATE OF CORRECTION

| | |
|---|---|
| PATENT NO. | : 11,367,480 B2 |
| APPLICATION NO. | : 17/104953 |
| DATED | : June 21, 2022 |
| INVENTOR(S) | : Michael ThaiThanh Phan |

It is certified that error appears in the above-identified patent and that said Letters Patent is hereby corrected as shown below:

In the Specification

Column 2, Line 30, delete "channel" and insert -- channel. --.

Column 4, Line 22, delete "level 1" and insert -- level-1 --.

Column 4, Line 32, delete "the" and insert -- in the --.

Column 4, Line 66, delete "multiplexer," and insert -- multiplexor, --.

Column 6, Line 4, delete "bitcell of the array 510." and insert -- of the bitcell array 510. --.

Column 6, Line 13, delete "bitcell of the array 510." and insert -- of the bitcell array 510. --.

In the Claims

Column 7, Line 35, in Claim 11, delete "word line" and insert -- wordline --.

Column 7, Line 36, in Claim 11, delete "word line" and insert -- wordline --.

Signed and Sealed this
Seventeenth Day of January, 2023

Katherine Kelly Vidal
*Director of the United States Patent and Trademark Office*